United States Patent
Ahmed

(10) Patent No.: US 6,417,554 B1
(45) Date of Patent: Jul. 9, 2002

(54) LATCH FREE IGBT WITH SCHOTTKY GATE

(75) Inventor: Iftikhar Ahmed, Bellflower, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/559,282

(22) Filed: Apr. 27, 2000

(51) Int. Cl.[7] .............................................. H01L 27/095
(52) U.S. Cl. ...................... 257/477; 257/330; 257/474; 257/479; 257/565; 257/587
(58) Field of Search .................. 257/474, 477, 257/479, 155, 330, 341, 342, 565, 587

(56) References Cited

U.S. PATENT DOCUMENTS

| | | | | |
|---|---|---|---|---|
| 5,111,253 A | * | 5/1992 | Korman et al. ............... | 357/15 |
| 5,478,764 A | * | 12/1995 | Inoue ......................... | 437/39 |
| 5,583,348 A | * | 12/1996 | Sundaram .................... | 257/73 |
| 5,773,851 A | * | 6/1998 | Nakamura et al. ........... | 257/133 |
| 5,783,491 A | * | 7/1998 | Nakamura ................... | 438/702 |
| 5,912,497 A | * | 6/1999 | Baliga ......................... | 257/366 |
| 6,198,127 B1 | * | 3/2001 | Kocon ........................ | 257/328 |
| 6,236,099 B1 | * | 5/2001 | Boden, Jr. .................. | 257/495 |
| 6,255,692 B1 | * | 7/2001 | Huang ........................ | 257/341 |
| 6,265,744 B1 | * | 7/2001 | Okumura .................... | 257/330 |

* cited by examiner

Primary Examiner—Eddie Lee
Assistant Examiner—N. Drew Richards
(74) Attorney, Agent, or Firm—Ostrolenk, Faber, Gerb & Soffen, LLP

(57) ABSTRACT

A three layer IGBT which cannot latch on is provided with a trench gate and a Schottky contact to the depletion region surrounding the trench gate. An emitter contact is connected to base diffusion regions which are diffused into the depletion region. The depletion region is formed atop an emitter region which emits carriers into the depletion region in response to the turn on of the gate and the injection of carriers from the Schottky gate.

19 Claims, 2 Drawing Sheets

LATCH FREE IGBT WITH SCHOTTKY GATE

FIELD OF THE INVENTION

This invention relates to semiconductor devices and more specifically relates to a novel insulated gate bipolar transistor (IGBT) which cannot latch on.

BACKGROUND OF THE INVENTION

IGBTs are well known devices and generally consist of a four layer device with a MOSgate. Thus, the devices generally employ a P type emitter layer which has an $N^+$ buffer layer thereon and an $N^-$ body regions atop the buffer. P type base diffusions are then formed in the $N^-$ body regions and N type emitter diffusions are formed in the P type base regions. The N type emitter regions are spaced from the boundaries of the P bases to define invertible channel regions. A MOSgate structure is then formed atop these channel regions.

Thus, the device is basically a four layer structure with the upper three layers and lower three layers defining respective bipolar transistors. As is well known, if the sum of the gains of these transistors exceeds unity, the device will latch on, that is, will remain conductive even after the gate turn on signal is removed.

It would be desirable to make an IGBT which cannot latch on. It would be further desirable to simplify the manufacture of such IGBTs by reducing the number of junctions which must be formed, and by reducing the thickness need for the $N^-$ body.

BRIEF SUMMARY OF THE INVENTION

In accordance with the invention, the emitter region (sometimes called a source region) of a conventional IGBT is replaced by a trench gate and a Schottky injecting contact on the $N^-$ body to initiate device conduction. As a result of the novel structure, the fourth layer (the $N^+$ emitter layer) of a conventional IGBT is removed and the device no longer has cascaded bipolar transistors and cannot latch on. Furthermore, the $N^-$ body region, which is usually epitaxially deposited, can be much thinner for a given voltage rating so that a less expensive starting wafer and fewer diffusion steps are needed for the manufacture of the device.

DETAILED DESCRIPTION OF THE DRAWINGS

Figure 1:
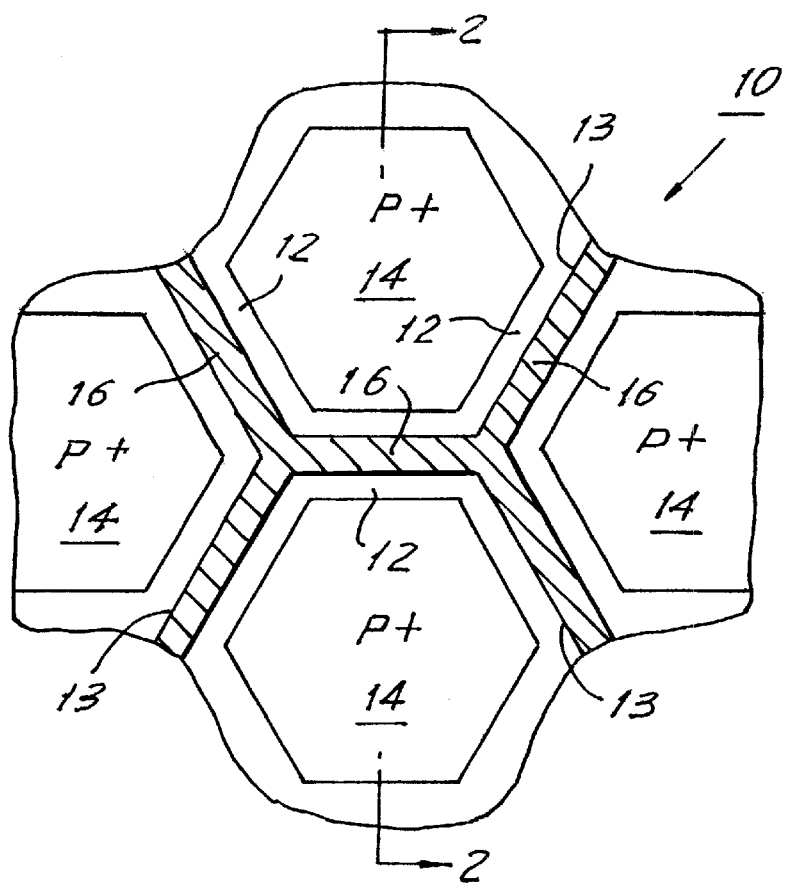
FIG. 1 is a top view of a small portion of the surface of the active area of a device chip made in accordance with the invention.
Figure 2:
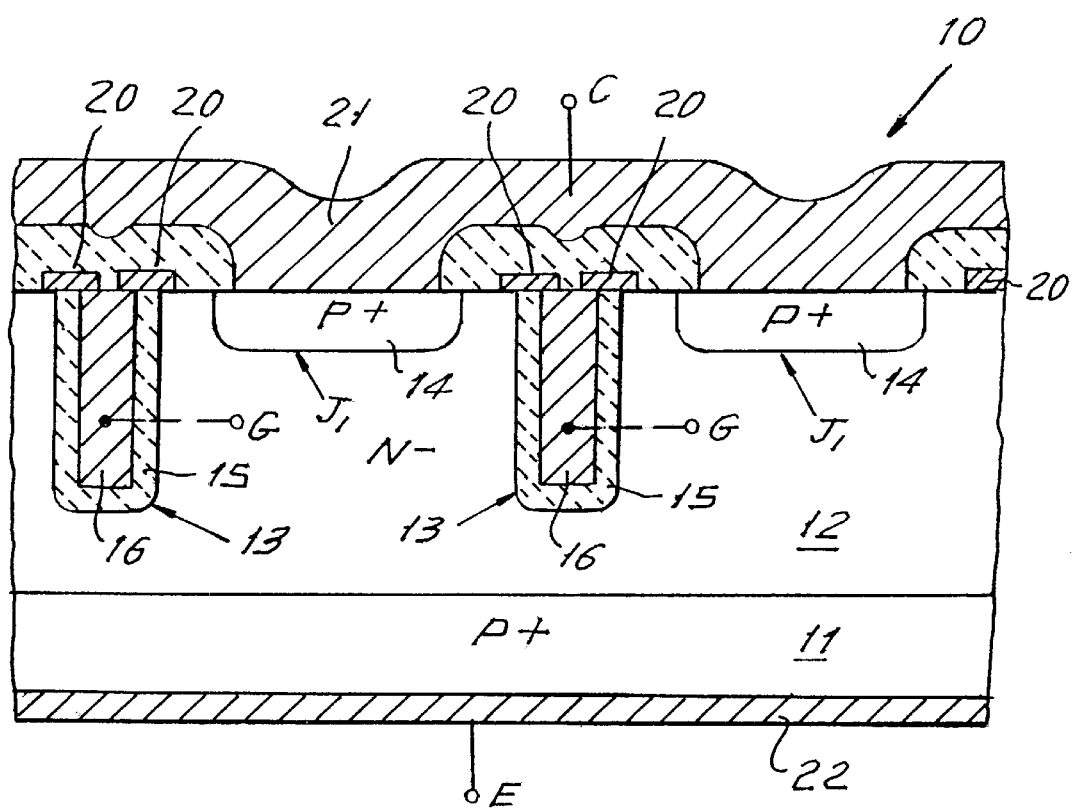
FIG. 2 is a cross-section of the device chip of FIG. 1, taken across section line 2—2 in FIG. 1.

Referring first to FIGS. 1 and 2, there is shown therein a small portion of a monocrystaline silicon chip 10. (The terms chip, wafer and die are frequently interchangeably used; a wafer being a large area disk in which a large number of die or chips are simultaneously formed and later singulated into the separate die or chips). The chip 10 has a bottom $P^+$ emitter region 11 (FIG. 2) which has an $N^-$ epitaxial layer 12 deposited thereon, which is a junction and trench receiving layer of the device. An $N^+$ buffer layer, not shown, can be disposed between $P^+$ layer 11 and $N^-$ layer 12.

The epitaxial layer 12 is then diffused to receive a plurality of symmetrically spaced hexagonally shaped P base regions 14. Base regions can have any other geometry, for example, squares, rectangles and stripes.

A trench 13 next encloses hexagonal base regions 14 in $N^-$ layer 12. Note that other topologies could be used, such as rectangles or stripes for the trenches 13, following the topology of the bases 14.

The trench 13 is then oxidized on its interior surfaces and at its bottom with a gate oxide layer 15 (FIG. 2) and the trench is then filled with a conductive polysilicon forming a polysilicon gate 16.

A conductive Schottky contact 20 is then formed atop the $N^-$ region 12 and is also in contact with polysilicon gate 16. The Schottky contact can be formed of polysilicon doped with TiWo; and can be any desired silicide. Alternatively, the Schottky contact 20 can be formed of aluminum.

An LTO (low temperature oxide) layer then covers and insluates polysilicon gate 16 and Schottky contact 20 and an aluminum collector contact 21 then overlaps the full surface of the chip and contacts $P^+$ regions 14. An emitter contact 22 is also applied to $P^+$ region 11.

Figure 3:
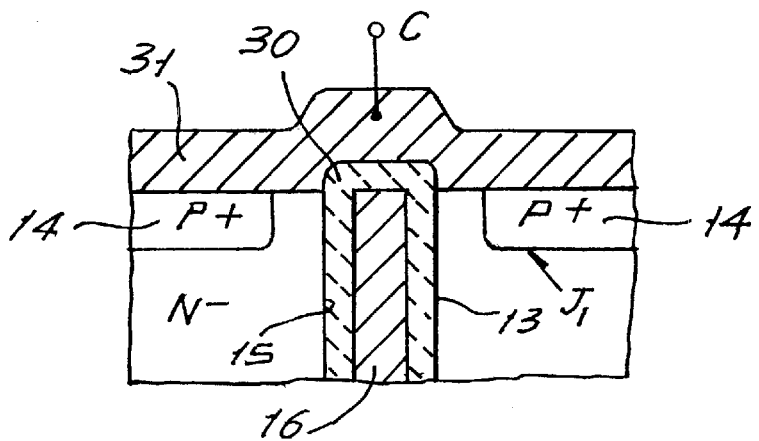
FIG. 3 shows a modification of the structure of FIG. 2 in accordance with a second embodiment of the invention.

In an alternative embodiment of the invention, and as shown in FIG. 3, the conductive polysilicon gate 16 is covered by oxide cap 30 and aluminum collector contact 31 acts both as a collector contact to P region 14 and as a Schottky contact to the exposed rings of $N^-$ material between the $P^+$ bases and the trench, but is insulated from the polysilicon gate 16.

In a preferred embodiment of the invention and, for example, for a 600 volt device, the spacing between $P^+$ bases (the Schottky area) is about 2 microns to about 4 microns although the exact spacing will be adjusted to control device speed.

The device of FIGS. 1, 2 and 3 operate as follows:

When the polysilicon gate 16 is off, and the device is reversed biased (the emitter 22 is at a higher voltage then the collector 21), the junction $J_1$ (FIG. 2) is forward biased and the entire $N^-$ region 12 is depleted to prevent conduction. Note that the device can be designed to withstand or block voltages of 600 volts and higher.

If now the polysilicon gate is made positive, an accumulation layer is formed around the $N^-$ silicon surrounding the gate oxide 15 which will cause the depletion region to bend upwardly toward the top of the trench. This then permits Schottky current to be injected into the $N^-$ region at about 0.3 to 0.4 volts. This, in turn causes hole injection from the $P^+$ emitter region 11 so that the entire area of $N^-$ region 12 turns on to conduct current with a relatively small forward voltage drop, $V_{ce}$.

When the gate is turned off, the depletion region is reinstated along the trench and conduction is quickly terminated. Note that the device cannot latch on because the PNP layer needed for latching is not present.

The device of FIG. 2 has a high impedance gate structure, like any conventional IGBT. The device of FIG. 3 has a lower gate impedance (like that of a PNP transistor) since base current only flows through the accumulation region initially in the turn on process. However, the device is easier to fabricate them that of FIG. 2.

Among the advantages of the invention, the $N^-$ epi layer 12 may be much thinner than that of an equivalent prior art IGBT and is like a high gain PNP transistor. Further, as previously stated the device cannot latch up and it is faster than a convention IGBT.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A three layer IGBT comprising, in combination; an emitter layer of one conductivity type, a body layer of the opposite conductivity type formed atop said emitter layer, a plurality of spaced base layers of said one conductivity type formed in the top of said body layer, a vertical trench disposed between and spaced apart from each of said spaced base layers; a gate insulation layer lining the walls and bottom of said trench and a conductive polysilicon filling the interior of said trenches to form a polysilicon gate, an emitter contact connected to the bottom of said emitter layer, a collector contact connected to each of said spaced base layers, and a Schottky contact connected to the top of said body layer in an area which at least one of surrounds and abuts the top of said trench.

2. The device of claim 1, wherein said device becomes conductive when a potential is connected to said polysilicon gate and said device is reverse biased, and wherein said device turns off without latching when said gate potential is removed from said polysilicon gate.

3. The device of claim 1, wherein said one conductivity type is N and said opposite conductivity type is P.

4. A three layer IGBT comprising, in combination; an emitter layer of one conductivity type, a body layer of the opposite conductivity type formed atop said emitter layer, a plurality of spaced base layers of said one conductivity type formed in the top of said body layer, a vertical trench disposed between each of said spaced base layers; a gate insulation layer lining the walls and bottom of said trench and a conductive polysilicon gate filling the interior of said trenches, an emitter contact connected to the bottom of said emitter layer, a collector contact connected to each of said spaced base layers, and a Schottky contact connected to the top of said body layer in an area which at least surrounds the top of said trench, wherein said Schottky contact is connected to said polysilicon gate.

5. A three layer IGBT comprising, in combination; an emitter layer of one conductivity type, a body layer of the opposite conductivity type formed atop said emitter layer, a plurality of spaced base layers of said one conductivity type formed in the top of said body layer, a vertical trench disposed between each of said spaced base layers; a gate insulation layer lining the walls and bottom of said trench and a conductive polysilicon gate filling the interior of said trenches, an emitter contact connected to the bottom of said emitter layer, a collector contact connected to each of said spaced base layers, and a Schottky contact connected to the top of said body layer in an area which at least surrounds the top of said trench; wherein said device becomes conductive when a potential is connected to said polysilicon gate and said device is reverse biased, and said device turns off without latching when said gate potential is removed from said polysilicon gate; and wherein said Schottky contact is connected to said polysilicon gate.

6. The device of claim 1, wherein said Schottky contact is connected to and is integral with said collector contact and is insulated from said polysilicon gate.

7. The device of claim 2, wherein said Schottky contact is connected to and is integral with said collector contact and is insulated from said polysilicon gate.

8. The device of claim 1, wherein said spaced base layers have enclosed cellular topologies.

9. The device of claim 4, wherein said spaced base layers have enclosed cellular topologies.

10. The device of claim 6, wherein said spaced base layers have enclosed cellular topologies.

11. The device of claim 1, wherein each of said bases are spaced by 2 to 4 microns from an adjacent base.

12. The device of claim 5, wherein each of said bases are spaced by 2 to 4 microns from an adjacent base.

13. The device of claim 6, wherein each of said bases are spaced by 2 to 4 microns from an adjacent base.

14. The device of claim 8, wherein each of said bases are spaced by 2 to 4 microns from an adjacent base.

15. The device of claim 1, wherein said Schottky contact is disposed in a top surface plane of said body layer.

16. The device of claim 1 wherein said Schottky contact is insulated from said collector contact.

17. The device of claim 2 wherein said Schottky contact is insulated from said collector contact.

18. The device of claim 4, wherein said Schottky contact is insulated from said collector contact.

19. The device of claim 5, wherein said Schottky contact is insulated from said collector contact.

* * * * *